(12) United States Patent
Tai et al.

(10) Patent No.: US 10,998,878 B2
(45) Date of Patent: May 4, 2021

(54) JOINED BODY OF PIEZOELECTRIC MATERIAL SUBSTRATE AND SUPPORT SUBSTRATE

(71) Applicant: NGK INSULATORS, LTD., Nagoya (JP)

(72) Inventors: Tomoyoshi Tai, Inazawa (JP); Ryosuke Hattori, Ichinomiya (JP)

(73) Assignee: NGK INSULATORS, LTD.

( * ) Notice: Subject to any disclaimer, the term of this patent is extended or adjusted under 35 U.S.C. 154(b) by 0 days.

(21) Appl. No.: 16/991,699

(22) Filed: Aug. 12, 2020

(65) Prior Publication Data

US 2020/0373905 A1 Nov. 26, 2020

Related U.S. Application Data

(63) Continuation of application No. PCT/JP2018/048179, filed on Dec. 27, 2018.

(30) Foreign Application Priority Data

Feb. 13, 2018 (JP) .............................. JP2018-022939

(51) Int. Cl.
  *H03H 9/02* (2006.01)
  *H01L 41/312* (2013.01)
  *H03H 3/08* (2006.01)
  *H03H 9/25* (2006.01)

(52) U.S. Cl.
  CPC ....... *H03H 9/02574* (2013.01); *H01L 41/312* (2013.01); *H03H 3/08* (2013.01); *H03H 9/02559* (2013.01); *H03H 9/25* (2013.01)

(58) Field of Classification Search
  CPC .................. H03H 9/02574; H03H 9/02559
  USPC ...... 310/313 R, 313 A, 313 B, 313 C, 313 D
  See application file for complete search history.

(56) References Cited

U.S. PATENT DOCUMENTS

| | | |
|---|---|---|
| 2004/0226162 A1 | 11/2004 | Miura et al. |
| 2013/0285768 A1 | 10/2013 | Watanabe et al. |
| 2014/0210316 A1 | 7/2014 | Hori et al. |
| 2014/0210317 A1 | 7/2014 | Tai et al. |

(Continued)

FOREIGN PATENT DOCUMENTS

| | | |
|---|---|---|
| JP | 3774782 B2 | 12/2004 |
| JP | 2014086400 A | 5/2014 |

(Continued)

OTHER PUBLICATIONS

International Preliminary Report on Patentability, issued in corresponding International Application No. PCT/JP2018/048179, dated Aug. 27, 2020 (2 pages).

(Continued)

*Primary Examiner* — Derek J Rosenau
(74) *Attorney, Agent, or Firm* — Flynn Thiel, P.C.

(57) ABSTRACT

A bonded body includes a supporting substrate, a piezoelectric material substrate composed of a material selected from the group consisting of lithium niobate, lithium tantalate and lithium niobate-lithium tantalate, and an amorphous layer present between the supporting substrate and piezoelectric material substrate. The amorphous layer contains one or more metal element selected from the group consisting of niobium and tantalum, an element constituting the supporting substrate and oxygen element. The concentration of the metal element in the amorphous layer is higher than the concentration of oxygen element and 20 to 65 atom %.

4 Claims, 3 Drawing Sheets

(56) References Cited

U.S. PATENT DOCUMENTS

2018/0175283 A1   6/2018   Akiyama et al.
2019/0036505 A1   1/2019   Akiyama et al.

FOREIGN PATENT DOCUMENTS

| JP | 5910763 B2 | 4/2015 |
| JP | 2016225537 A | 12/2016 |
| WO | 2014077212 A1 | 5/2014 |
| WO | 2014077213 A1 | 5/2014 |
| WO | 2017134980 A1 | 8/2017 |

OTHER PUBLICATIONS

English Translation of the Written Opinion of the International Search Authority, issued in corresponding International Application No. PCT/JP2018/048179, dated Apr. 2, 2019 (5 pages).
Howladar Matiar et al. 207th ECS Meeting, Abstract # 523, Activation Process and Bonding Mechanism of Si/LiNbO3 and LiNbO3/LiNbo3 at Room Temperature, 2005 (1 page).
Yoshikaju Zikuhara et al. Sequential Activation Process of oxygen RIE and nitrogen Radical for LiTaO3 and Si Wafer Bonding, ECS Transactions, 3 (6) 91-98 (2006) (9 pages).
T. Plach et al. Mechanisms for room temperature direct wafer bonding, Journal of Applied Physics 113, 094905 (2013) (8 pages).
International Search Report with English Translation issued in corresponding International Application No. PCT/JP2018/048179 dated Apr. 2, 2019 (5 pages).
Written Opinion of International Searching Authority issued in corresponding International Application No. PCT/JP2018/048179 dated Apr. 2, 2019 (4 pages).

US 10,998,878 B2

JOINED BODY OF PIEZOELECTRIC MATERIAL SUBSTRATE AND SUPPORT SUBSTRATE

CROSS-REFERENCE TO RELATED APPLICATIONS

This is a continuation of PCT/JP2018/048179, filed Dec. 27, 2018, which claims priority from Japanese Application No. 2018-022939, filed Feb. 13, 2018, the entire contents of which are hereby incorporated by reference.

TECHNICAL FIELD

The present invention relates to a bonded body of a piezoelectric material substrate and supporting substrate.

BACKGROUND ARTS

It has been widely used an SOI substrate composed of a high resistance Si/SiO$_2$ thin film/Si thin film, for realizing a high-performance semiconductor device. Plasma activation is used for realizing the SOI substrate. This is because the bonding can be realized at a relatively low temperature (400° C.). It is proposed a composite substrate composed of similar Si/SiO$_2$ thin film/piezoelectric thin film for improving the performance of a piezoelectric device (patent document 1). According to patent document 1, the piezoelectric material substrate composed of lithium niobate or lithium tantalate and silicon substrate with a silicon oxide layer formed thereon are activated by ion activation method, followed by the bonding.

It is further proposed a filter of multi-layered structure by forming a single or multiple dielectric film at the bonding interface (patent document 2).

Patent document 3 discloses that lithium tantalate and sapphire or ceramic are bonded through a silicon oxide layer by plasma activation method.

According to non-patent document 1, it is described that lithium tantalate substrate and a silicon substrate with a silicon oxide film provided thereon are bonded with each other by irradiating O$_2$ RIE plasma (13.56 MHz) and microwave (2.45 GHz) of N$_2$ sequentially.

When Si and SiO$_2$/Si are bonded with each other by plasma activation, a sufficiently high bonding strength is obtained by the formation of Si—O—Si bonds at the interface. Further, at the same time, Si is oxidized to SiO$_2$ so that the flatness is improved and the bonding as described above is facilitated at the uppermost surface (Non-patent document 2).

According to patent document 4, surfaces of a silicon substrate and lithium tantalate substrate are subjected to surface activation by argon beam, followed by the bonding of the respective surfaces. It is thereby generated an amorphous layer containing tantalum, silicon argon and oxygen along an interface between the silicon substrate and lithium tantalate substrate.

RELATED DOCUMENTS

Non-Patent Documents (Non-patent document 1)
ECS Transactions, 3 (6) 91-98 (2006)
(Non-patent document 2)
J. Applied Physics 113, 094905 (2013)

Patent Documents (Patent document 1) Japanese Patent Publication No. 2016-225537A
(Patent document 2) Japanese Patent No. 5910763B
(Patent document 3) Japanese Patent No. 3774782B
(Patent document 4) WO 2017/134980 A1

SUMMARY OF THE INVENTION

However, as shown in patent document 4, in the case that a silicon substrate and lithium tantalate substrate are subjected to surface activation and direct bonding, it was proved that the bonding strength was low and peeling occurred when a stress is applied on the bonded body during the polishing or the like. As tantalum element is considerably diffused into the amorphous layer so that the bonding strength is considered to be high, it is not clear the reason that the bonding strength is not high above some degree.

An object of the present invention is, in a bonded body of a supporting substrate and a piezoelectric material substrate composed of a material selected from the group consisting of lithium niobate, lithium tantalate and lithium niobate-lithium tantalate, to improve the bonding strength of the bonded body.

The bonded body of the present invention comprises:
  a supporting substrate;
  a piezoelectric material substrate comprising a material selected from the group consisting of lithium niobate, lithium tantalate and lithium niobate-lithium tantalate; and
  an amorphous layer present between the supporting substrate and the piezoelectric material substrate and comprising one or more metal element selected from the group consisting of niobium and tantalum, an element constituting said supporting substrate and oxygen element;
  wherein a concentration of the metal element in the amorphous layer is higher than a concentration of the oxygen element and 20 to 65 atom %.

In directly bonding a supporting substrate and a piezoelectric material substrate composed of lithium niobate or the like, the inventors have studied the reason that the bonding strength of a bonded body is reduced and the peeling during the processing of the piezoelectric material substrate is facilitated.

That is, as shown in patent document 4, in the case that the silicon substrate and lithium tantalate substrate are subjected to surface activation and direct bonding, it was proved that the bonding strength was low and the substrates are peeled upon a stress applied on the bonded body by polishing or the like. It is speculated that tantalum element is considerably diffused into the amorphous layer in the bonded body and the bonding strength should have been high.

Thus, the condition and energy during the surface activation of surfaces of the supporting substrate and piezoelectric material substrate were variously changed, and the state of the amorphous layer and bonding strength were variously studied. As a result, it was found that the bonding strength was considerably improved by diffusing one or more metal element selected from the group consisting of tantalum and niobium into the amorphous layer and, in addition to this, the concentration of the metal element is made higher than the concentration of oxygen element.

EMBODIMENTS FOR CARRYING OUT THE INVENTION

Figure 1A:
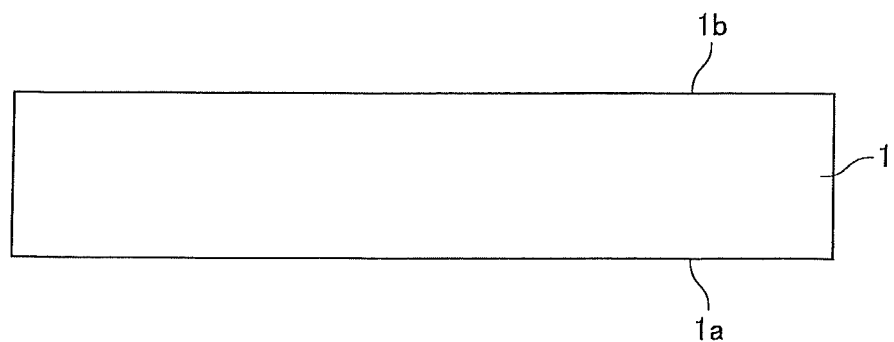
FIG. 1(a) shows a piezoelectric material substrate 1.

The present invention will be described in detail below, appropriately referring to the drawings.

Figure 1B:
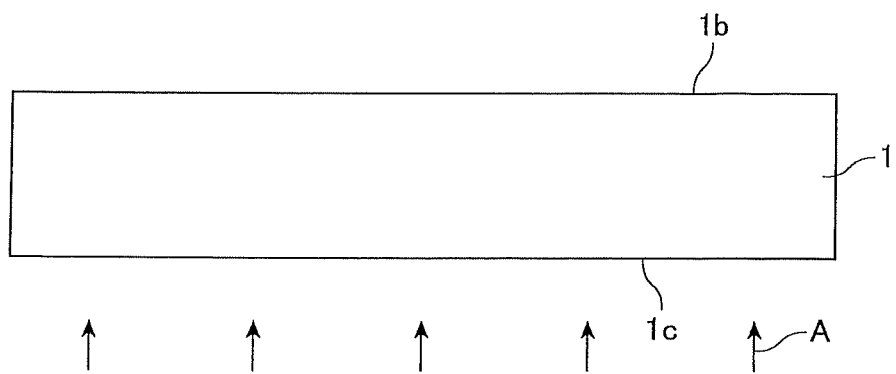
FIG. 1(b) shows the state that a bonding surface 1a of the piezoelectric material substrate 1 is activated to generate an activated bonding surface 1c.

First, as shown in FIG. 1(a), it is prepared a piezoelectric material substrate 1 having a pair of surfaces 1a and 1b. According to the present example, 1a is made a bonding surface. Then, as shown in FIG. 1(b), Ar beam is irradiated onto a bonding surface 1a of the piezoelectric material substrate 1 as an arrow A to obtain a surface-activated bonding surface 1c.

Figure 2A:
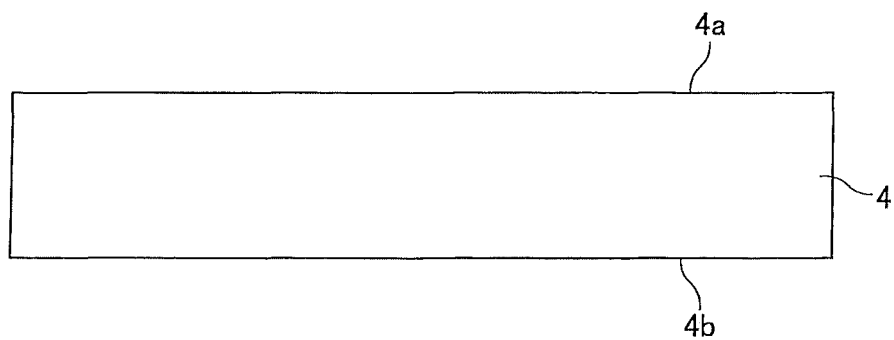
FIG. 2(a) shows a supporting substrate 4.
Figure 2B:
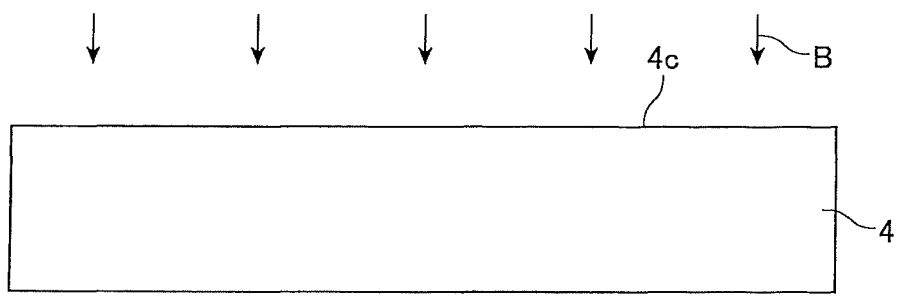
FIG. 2(b) shows the state that a bonding surface 4a of the supporting substrate 4 is activated to generate an activated bonding surface 4c.

On the other hand, as shown in FIG. 2(a), it is prepared a supporting substrate 4 having a pair of surfaces 4a and 4b. According to the present example, 4a is made a bonding surface. Then, as shown in FIG. 2(b), Ar beam is irradiated onto the surface 4a of the supporting substrate 4 as an arrow B to perform the surface activation to form an activated bonding surface 4c.

Figure 3A:
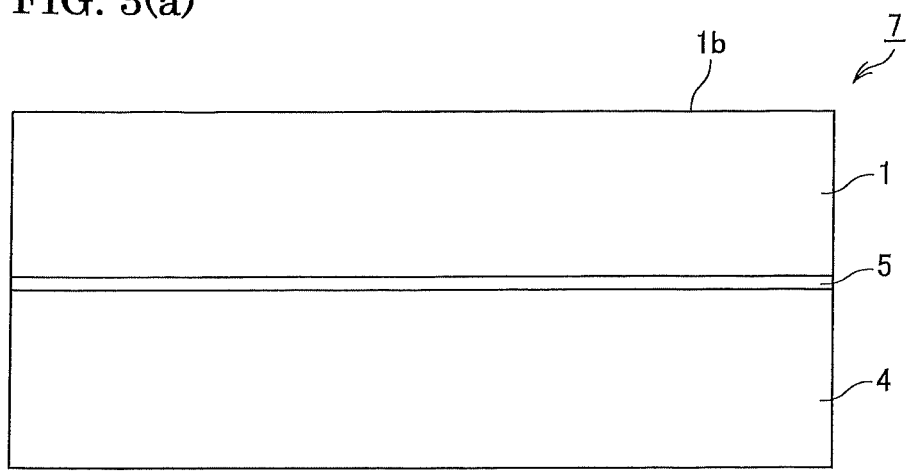
FIG. 3(a) shows a bonded body 7 obtained by directly bonding the piezoelectric material substrate 1 and supporting substrate 4.
Figure 3B:
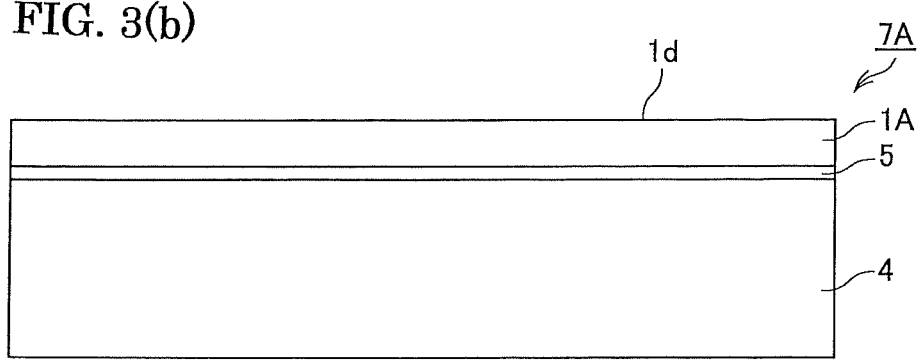
FIG. 3(b) shows the state that a piezoelectric material substrate 1A of the bonded body 7 is polished and thinned.
Figure 3C:
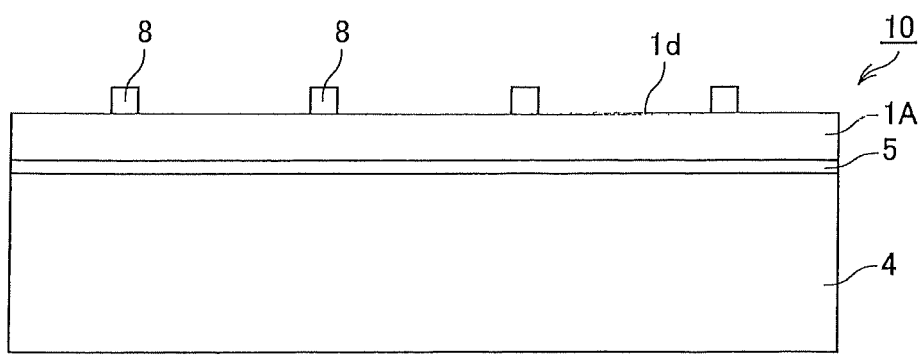
FIG. 3(c) shows an acoustic wave device 10.

Then, as shown in FIG. 3(a), the activated bonding surface 1c of the piezoelectric material substrate 1 and the activated bonding surface 4c of the supporting substrate 4 are contacted and directly bonded with each other to obtain a bonded body 7. An amorphous layer 5 is generated in the bonded body 7. At this stage, electrodes may be provided on the piezoelectric material substrate 1. However, preferably, as shown in FIG. 3(b), the main surface 1b of the piezoelectric material substrate 1 is processed to thin the substrate 1 to obtain a thinned piezoelectric material substrate 1A. 1d represents a processed surface. Then, as shown in FIG. 3(c), predetermined electrodes 8 may be formed on the processed surface 1d of the piezoelectric material substrate 1A of the bonded body 7A to obtain an acoustic wave device 10.

The respective components of the present invention will be described below in the order.
(Amorphous Layer)

According to the present invention, the amorphous layer present between the supporting substrate 4 and the piezoelectric material substrate 5 contains one or more metal element selected from the group consisting of niobium and tantalum, an element constituting the supporting substrate and oxygen element. The concentration of the metal element in the amorphous layer is higher than a concentration of oxygen element and 20 to 65 atom %. By providing such amorphous layer 5, it is possible to improve the bonding strength of the supporting body 4 and piezoelectric material substrate 1.

One or more metal element selected from the group consisting of niobium and tantalum may be niobium alone, tantalum alone or both of niobium and tantalum. In the case that both of niobium and tantalum are contained in the amorphous layer 5, the concentration of the metal element is a total value of the concentrations of niobium and tantalum. Further, in the case that the element constituting the supporting substrate 4 is of a single kind, the element constituting the amorphous layer 5 is also of a single kind. In the case that plural kinds of elements constitute the supporting substrate 4, the element constituting the supporting substrate 4 is one or plural kind(s) among them. It is further provided that niobium, tantalum and oxygen are excluded from the element constituting the supporting substrate 4.

According to the present invention, the concentration of the metal element is higher than a concentration of oxygen element in the amorphous layer 5 and 20 to 65 atom %. On the viewpoint of the present invention, the concentration of the metal element in the amorphous layer may more preferably be 20.3 atom % or higher and more preferably be 63.2 atom % or lower.

According to a preferred embodiment, provided that 1.0 is assigned to the concentration of the metal element in the amorphous layer, the concentration of oxygen element is 0.30 to 0.65, and more preferably, the concentration of oxygen element is 0.32 to 0.62, so that the bonding strength can be further improved.

Further, the concentration of oxygen element in the amorphous layer 5 may preferably be made 12 to 26 atom %.

In the amorphous layer 5, it is provided that the element constituting the supporting substrate 4 is made an element other than tantalum, niobium and oxygen elements. The element is preferably silicon. The concentration of the element constituting the supporting substrate 4 in the amorphous layer 5 is preferably 13 to 64 atom % on the viewpoint of the present invention.

Further, argon or nitrogen may be contained in the amorphous layer 5. The concentration of argon or nitrogen may 1.0 to 5.0 atom %.

The thickness of the amorphous layer 5 may preferably be 4 to 12 nm.

Further, the presence of the amorphous layer 5 is to be confirmed as follows.
Measuring System:
The microstructure is observed using a transmission-type electron microscope "H-9500" supplied by Hitachi High-Tech Corporation.
Measuring Conditions:
A sample of a thinned piece is observed by FIB (Focused Ion Beam method) at an accelerating voltage of 200 kV.

The concentrations of the respective elements in the amorphous layer 5 is to be measured as follows.
Measuring System:
The elementary analysis is performed using an elementary analyzing system ("JEM-ARM200F" supplied by JEOL Ltd.). Measurement conditions:
A sample of a thinned piece is observed by FIB (Focused Ion Beam method) at an accelerating voltage of 200 kV.
(Supporting Substrate)
The material of the supporting substrate 4 is not particularly limited, and the followings are exemplified.
The material of the supporting substrate 4 is preferably a material selected from the group consisting of silicon, quartz, sialon, mullite, sapphire and translucent alumina. It is thereby possible to further improve the temperature characteristics of frequency of the acoustic wave device.

(Piezoelectric Material Substrate)

The piezoelectric material substrate 1 used in the present invention is made lithium tantalate (LT), lithium niobate (LN) or lithium niobate-lithium tantalate solid solution. As the materials have high propagation speeds of a surface acoustic wave and large electro-mechanical coupling factors, it is preferred for use in a surface acoustic wave device for high frequency and wide-band frequency applications.

Further, the normal direction of the main surface of the piezoelectric material substrate 1 is not particularly limited. For example, in the case that the piezoelectric material substrate 1 is made of LT, it is preferred to use the substrate rotated from Y-axis toward Z-axis by 32 to 50° (180°, 58° to 40°, 180° on Eulerian angle representation) around X-axis, which is a direction of propagation of a surface acoustic wave, because of a low propagation loss. In the case that the piezoelectric material substrate 1 is made of LN, (i) it is preferred to use the substrate rotated from Z-axis toward −Y-axis by 37.8° (0°, 37.8°, 0° on Eulerian angle representation) around X-axis, which is a direction of propagation of a surface acoustic wave, because of a large electro-mechanical coupling factor. Alternatively, (ii) it is preferred to use the substrate rotated from Y-axis toward Z-axis by 40 to 65° (180°, 50 to 25°, 180° on Eulerian angle representation) around X-axis, which is a direction of propagation of a surface acoustic wave, because a high acoustic speed can be obtained. Further, although the size of the piezoelectric material substrate is not particularly limited, for example, the diameter may be 100 to 200 mm and thickness may be 0.15 to 50 μm.

(Surface Activation Treatment)

The surface 1a of the piezoelectric material substrate and the surface 4a of the supporting substrate 4 are subjected to surface activation treatment. At this time, neutralized beam may be irradiated onto the surface 1a of the piezoelectric material substrate 1 and surface 4a of the supporting substrate 4, so that the surface 1a of the piezoelectric material substrate 1 and surface 4a of the supporting substrate 4 can be activated. At this stage, the voltage and current for irradiating the neutralized beam, gas flow rate of atoms in the beam, and irradiation time of the beam can be controlled to control the concentration of the elements at the bonding interface.

When the activation of the surfaces is performed using the neutralized beam, it is preferred to use a system described in JP 2014-086400A to generate the neutralized beam, which is irradiated. That is, it is used a high-speed atomic beam source of saddle field type as the beam source. Then, an inert gas is introduced into the chamber and a high voltage is applied onto electrodes from a direct current electric source. By this, electric field of saddle field type generated between the electrode (positive electrode) and a housing (negative electrode) causes motion of electrons, e, so that atomic and ion beams derived from an inert gas are generated. Among the beams reached at a grid, the ion beam is neutralized at the grid, and the beam of neutral atoms is emitted from the high-speed atomic beam source. Atomic species forming the beam may preferably be an inert gas (argon, nitrogen or the like).

In the activation step by beam irradiation, the voltage may preferably be made 0.2 to 2.0 kV, the current may preferable be made 20 to 200 mA, the flow rate of an inert gas may preferably be made 20 sccm to 80 sccm, and the time duration of the beam irradiation may preferably be made 15 to 300 sec.

Then, the activated surfaces are contacted and bonded with each other under vacuum atmosphere. The temperature at this time may be ambient temperature, specifically 40° C. or lower and more preferably 30° C. or lower. Further, the temperature during the bonding may more preferably be 20° C. or higher and 25° C. or lower. The pressure at the bonding is preferably 100 to 20000N.

The activated bonding surface 1c of the piezoelectric material substrate 1 and the activated bonding surface 4c of the supporting substrate 4 are then contacted with and bonded with each other. Thereafter, annealing treatment may preferably be performed to improve the bonding strength. The temperature during the annealing treatment may preferably be 100° C. or higher and 300° C. or lower.

(Acoustic Wave Device)

The bonded bodies 7 and 7A of the present invention may preferably be applied as an acoustic wave device 10.

As the acoustic wave device 10, a surface acoustic wave device, Lamb wave-type device, thin film resonator (FBAR) or the like is known. For example, the surface acoustic wave device is produced by providing an input side IDT (Interdigital transducer) electrodes (also referred to as comb electrodes or interdigitated electrodes) for oscillating surface acoustic wave and IDT electrode on the output side for receiving the surface acoustic wave on the surface of the piezoelectric material substrate. By applying high frequency signal on the IDT electrode on the input side, electric field is generated between the electrodes, so that the surface acoustic wave is oscillated and propagated on the piezoelectric material substrate. Then, the propagated surface acoustic wave is drawn as an electrical signal from the IDT electrodes on the output side provided in the direction of the propagation.

A material forming the electrode 8 of the piezoelectric material substrate 1A may preferably be aluminum, an aluminum alloy, copper or gold, and more preferably be aluminum or the aluminum alloy. The aluminum alloy may preferably be Al with 0.3 to 5 weight % of Cu mixed therein. In this case, Ti, Mg, Ni, Mo or Ta may be used instead of Cu.

EXAMPLES

It was produced the bonded body 7A, according to the method described referring to FIGS. 1 to 3.

Specifically, it was used a tantalum niobate substrate (LT substrate) having an orientation flat (OF) part, a diameter of 4 inches and a thickness of 250 μm as the piezoelectric material substrate 1. Further, as the supporting substrate 4, it was prepared a silicon substrate having an OF part, a diameter of 4 inches and a thickness of 230p m. As the LT substrate, it was used a 46°–Y-cut X propagation LT substrate whose cut-out angle is of a rotated Y-cut plate and in which the propagation direction of surface acoustic wave (SAW) is X. The surface 1a of the piezoelectric material substrate 1 and the surface 4a of the supporting substrate 4 were subjected to mirror surface polishing so that each arithmetic average roughness Ra was made 1 nm. The arithmetic average roughness was evaluated by observing a square visual field of a length of 10 μm and a width of 10 μm by an atomic force microscope (AFM).

The surface 1a of the piezoelectric material substrate 1 and surface 4a of the supporting substrate 4 were cleaned to remove contaminants, followed by introduction into a vacuum chamber. The inside was drawn into vacuum of the order of $10^{-6}$ Pa, and high-speed atomic beam was irradiated onto the bonding surfaces 1a and 4a of the respective substrates in 135 KJ. Then, the beam-irradiated surface (activated bonding surface) 1c of the piezoelectric material substrate 1 and the activated bonding surface 4c of the supporting substrate 4 were contacted with each other, followed by pressurizing at 10000N for 2 minutes so that the respective substrates are bonded with each other.

Here, the energy of irradiation of the beam (Irradiation amount of FAB) was changed as shown in tables 1 and 2. Then, it was confirmed that the amorphous layer 5 was present along the bonding interface of each of the thus obtained bonded bodies 7, the concentrations of the respective elements in the amorphous layer 5 were measured, and the results were shown in tables 1 and 2. Further, the relative ratios of the concentrations of the respective elements, provided that 1.00 is assigned to the concentration of tantalum element in the amorphous layer 5, are shown in tables 1 and 2.

Further, the bonding strengths of the bonded bodies of the respective examples were evaluated by crack opening method and were shown in tables 1 and 2.

TABLE 1

|  |  | Comparative Example 1 | Comparative Example 2 | Comparative Example 3 | Comparative Example 4 |
|---|---|---|---|---|---|
| Piezoelectric material substrate |  | Lithium tantalate | Lithium tantalate | Lithium tantalate | Lithium tantalate |
| Supporting substrate |  | Si | Si | Si | Si |
| FAB irradiation amount (kJ) |  | 45 | 22.5 | 270 | 225 |
| Bonding strength (J/m2) |  | 0.8 | 0.2 | 0.5 | 1.0 |
| Concentrations of elements at bonding interface (atom %) | Ta | 16.6 | 9.2 | 75.3 | 38.5 |
|  | O | 23.1 | 7.8 | 14.8 | 48.6 |
|  | Si | 53.6 | 79.5 | 7.0 | 10.4 |
|  | Ar | 2.4 | 3.5 | 2.9 | 2.5 |
| Ratios of concentrations of elements with respect to Ta | Ta | 1.00 | 1.00 | 1.00 | 1.00 |
|  | O | 1.39 | 0.84 | 0.20 | 1.26 |
|  | Si | 3.23 | 8.64 | 0.09 | 0.27 |
|  | Ar | 0.14 | 0.38 | 0.04 | 0.06 |

TABLE 2

|  |  | Inventive Example 1 | Inventive Example 2 | Inventive Example 3 |
|---|---|---|---|---|
| Piezoelectric material substrate |  | Lithium tantalate | Lithium tantalate | Lithium tantalate |
| Supporting substrate |  | Si | Si | Si |
| FAB irradiation amount (kJ) |  | 135 | 90 | 180 |
| Bonding strength (J/m2) |  | 2.2 | 1.8 | 1.9 |
| Concentrations of elements at bonding interface (atom %) | Ta | 41.5 | 20.3 | 63.2 |
|  | O | 17.4 | 12.6 | 20.2 |
|  | Si | 38.1 | 63.4 | 13.6 |
|  | Ar | 4.2 | 3.7 | 3.0 |
| Ratios of concentrations of elements with respect to Ta | Ta | 1.00 | 1.00 | 1.00 |
|  | O | 0.42 | 0.62 | 0.32 |
|  | Si | 0.92 | 3.12 | 0.22 |
|  | Ar | 0.08 | 0.18 | 0.05 |

According to comparative examples 1 and 2, as the concentration of tantalum in the amorphous layer 5 is low (16.6 atom % in the comparative example 1, and 9.2 atom % in the comparative example 2) and the diffusion of tantalum is insufficient, the bonding strength proved to be low (bonding strengths are 0.8 J/m² in the comparative example 1 and 0.2 J/m² in the comparative example 2).

According to comparative example 3, the concentration of tantalum in the amorphous layer 5 is high (75.3 atom % in the comparative example 3), and the bonding strength proved to be low (bonding strength in the comparative example 3 was 0.5 J/m²).

According to the comparative example 4, although tantalum element is appropriately diffused into the amorphous layer 5 (38.5 atom % in the comparative example 4), the concentration of tantalum element is lower than the concentration of oxygen element (the concentration of oxygen element is 1.26 in the comparative example 4, provided that 1.0 is assigned to the concentration of tantalum element). As a result, the bonding strength was proved to be low (the bonding strength was 1.0 J/m² in the comparative example 4).

On the other hand, according to examples 1 to 3 of the present invention, a high bonding strength was obtained. Specifically, according to the inventive examples 1 to 3, the concentration of tantalum was appropriately diffused into the amorphous layer 5 (41.5 atom % in the inventive example 1, 20.3 atom % in the inventive example 2, and 63.2 atom % in the comparative example 3), and the concentration of tantalum element was proved to be higher than the concentration of oxygen element (provided that 1.0 is assigned to the concentration of tantalum element, the concentrations of oxygen element was 0.42 in the inventive example 1, 0.62 in the inventive example 2 and 0.32 in the inventive example 3). As a result, the bonding strength of the piezoelectric material substrate 1 and supporting substrate 4 can be made high (2.2 J/m² in the inventive example 1, 1.8 J/m² in the inventive example 2 and 1.9 J/m² in the inventive example 3).

Further, in the case that lithium niobate substrate (LN substrate) was used instead of lithium tantalate substrate (LT substrate) as the piezoelectric material substrate 1, the similar results were obtained.

Specifically, as shown in the inventive example 4 of table 3, niobium element was appropriately diffused into the amorphous layer 5 (59.6 atom % in the inventive example 4), and the concentration of niobium element is proved to be higher than the concentration of oxygen element (provided that 1.0 is assigned to the concentration of niobium element, the concentration of oxygen element was 0.43 in the inventive example 4). As a result, the bonding strength of the piezoelectric material substrate 1 and supporting substrate 4 can be made high (2.0 J/m² in the inventive example 4.

TABLE 3

|  | Inventive Example 4 |
|---|---|
| Piezoelectric material substrate | Lithium niobate |
| Supporting substrate | Si |
| FAB irradiation amount (kJ) | 135 |
| Bonding strength (J/m²) | 2.0 |

TABLE 3-continued

|  |  | Inventive Example 4 |
|---|---|---|
| Concentration of element at bonding interface (atom %) | Nb | 59.6 |
|  | O | 25.5 |
|  | Si | 13.4 |
|  | Ar | 1.5 |
| Ratio of concentration of element with respect to Nb | Nb | 1.0 |
|  | O | 0.43 |
|  | Si | 0.22 |
|  | Ar | 0.03 |

The invention claimed is:

1. A bonded body comprising:

a supporting substrate;

a piezoelectric material substrate comprising a material selected from the group consisting of lithium niobate, lithium tantalate and lithium niobate-lithium tantalate; and an amorphous layer present between said supporting substrate and said piezoelectric material substrate and comprising one or more metal elements selected from the group consisting of niobium and tantalum, an element constituting said supporting substrate and oxygen;

wherein a concentration of said metal element in said amorphous layer is higher than a concentration of said oxygen and 20 to 65 atom %, wherein said concentration of said oxygen is 0.30 to 0.65 provided that 1.0 is assigned to said concentration of said metal element in said amorphous layer.

2. The bonded body of claim 1, wherein said amorphous layer comprises argon.

3. The bonded body of claim 1, wherein said supporting substrate comprises silicon.

4. The bonded body of claim 1, wherein said piezoelectric material substrate has a thickness of 50 μm or smaller.

* * * * *